United States Patent [19]
Sandhu et al.

[11] Patent Number: 5,235,312
[45] Date of Patent: Aug. 10, 1993

[54] POLYSILICON RESISTORS AND METHODS OF FABRICATION

[75] Inventors: Gurtej Sandhu; Pierre C. Fazan, both of Boise, Id.

[73] Assignee: Micron Technology, Inc., Boise, Id.

[21] Appl. No.: 795,194

[22] Filed: Nov. 18, 1991

[51] Int. Cl.[5] .......................................... H01C 1/012
[52] U.S. Cl. ................................... 338/307; 338/306; 338/308; 338/314; 427/96; 427/101; 29/610.1; 437/918
[58] Field of Search ..................... 338/306, 307–308, 338/314; 427/96, 101, 102, 103, 123; 29/610.1; 437/60, 918

[56] References Cited

U.S. PATENT DOCUMENTS

| | | | |
|---|---|---|---|
| 4,489,104 | 12/1984 | Lee | 338/308 X |
| 4,952,904 | 8/1990 | Johnson et al. | 338/306 |
| 5,006,421 | 4/1991 | Yang et al. | 338/308 |
| 5,021,867 | 6/1991 | Przybysz | 338/307 |
| 5,081,439 | 1/1992 | Natzle et al. | 338/195 |

Primary Examiner—Marvin M. Lateef
Attorney, Agent, or Firm—Wells, St. John, Roberts, Gregory & Matkin

[57] ABSTRACT

A semiconductor processing method of forming a resistor device includes, a) providing a layer of conductively doped polysilicon atop a substrate to a selected thickness, the layer of polysilicon having an upper surface and a base, the layer of polysilicon having grain boundaries therewithin which extend from the upper surface to the base and define polysilicon grains; b) oxidizing the polysilicon layer at a temperature from about 850° C. to about 1050° C. for a selected period of time to form $SiO_x$ within the polysilicon layer along the grain boundaries and down to the base to separate individual grains of polysilicon within the layer; and c) patterning the oxidized polysilicon layer to form a resistor device within an integrated circuit.

20 Claims, 2 Drawing Sheets

POLYSILICON RESISTORS AND METHODS OF FABRICATION

TECHNICAL FIELD

This invention relates generally to formation of polysilicon resistors.

BACKGROUND OF THE INVENTION

Resistors are common electronic devices utilized in integrated circuits. One known material for resistor fabrication is polysilicon. Polysilicon by itself is highly insulative. Conductivity enhancing impurities, such as for example boron or phosphorus, can be provided in polysilicon to render it conductive. The quantity of such impurities provided within a polysilicon layer will vary its conductivity. Accordingly, various resistors can be formed of polysilicon of a selected resistance depending upon impurity concentration.

This invention concerns a technique for increasing the resistance in a given polysilicon resistor construction apart from reducing impurity concentration.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A semiconductor processing method of forming a resistor device comprises:

providing a layer of conductively doped polysilicon atop a substrate to a selected thickness, the layer of polysilicon having an upper surface and a base, the layer of polysilicon having grain boundaries therewithin which extend from the upper surface to the base and define polysilicon grains;

oxidizing the polysilicon layer at a temperature from about 850° C. to about 1050° C. for a selected period of time to form $SiO_x$ within the polysilicon layer along the grain boundaries and down to the base to separate individual grains of polysilicon within the layer; and patterning the oxidized polysilicon layer to form a resistor device within an integrated circuit.

Figure 1:
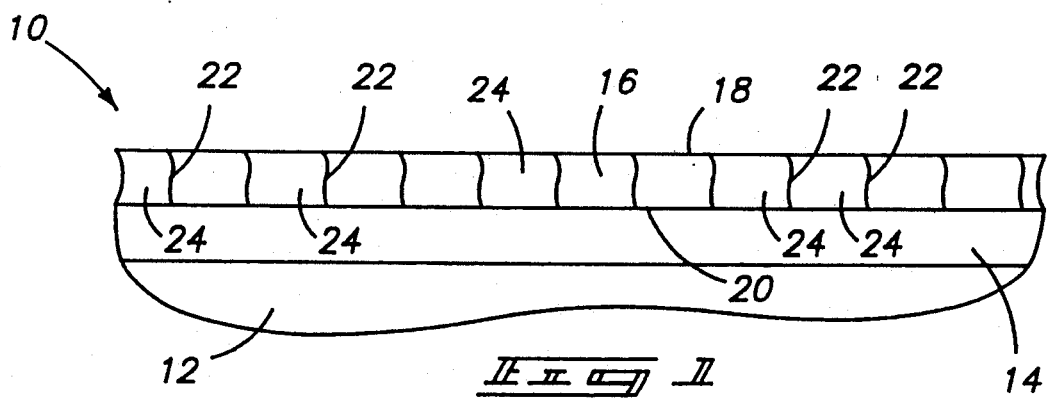
FIG. 1 is a diagrammatic section view of a semiconductor wafer at a processing step in accordance with the invention.

More particularly and with reference to FIG. 1, a semiconductor wafer is illustrated generally by reference numeral 10. For purposes of illustration, wafer 10 is comprised of a bulk substrate 12 having an insulating layer 14 of $SiO_x$ applied thereatop. A layer 16 of conductively doped polysilicon is provided atop the substrate to a selected thickness. The preferred thickness for layer 16 is from about 500 Angstroms to about 4000 Angstroms, with from about 1000 Angstroms to about 2000 Angstroms being most preferred. For purposes of the continuing discussion, polysilicon layer 16 has an upper surface 18 and a lower base 16.

Polysilicon layer 20 is provided atop wafer 10 by techniques known by people of skill in the art to produce the illustrated columnar grain polysilicon. Such polysilicon has a series of grain boundaries 22 which extend from upper surface 18 to base 20, thereby defining a series of individual grains 24.

Figure 2:
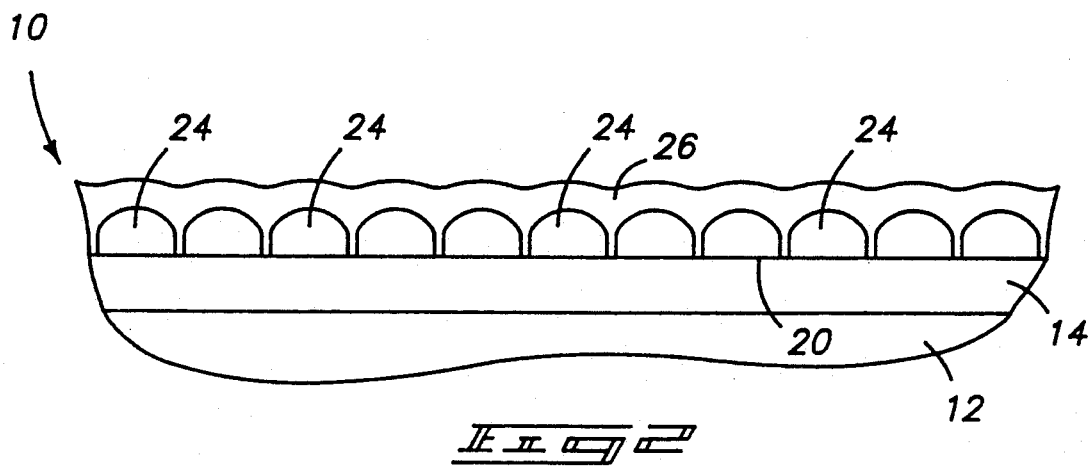
FIG. 2 is a diagrammatic section view of the FIG. 1 wafer illustrated at a processing step subsequent to that shown by FIG. 1.
Figure 3:
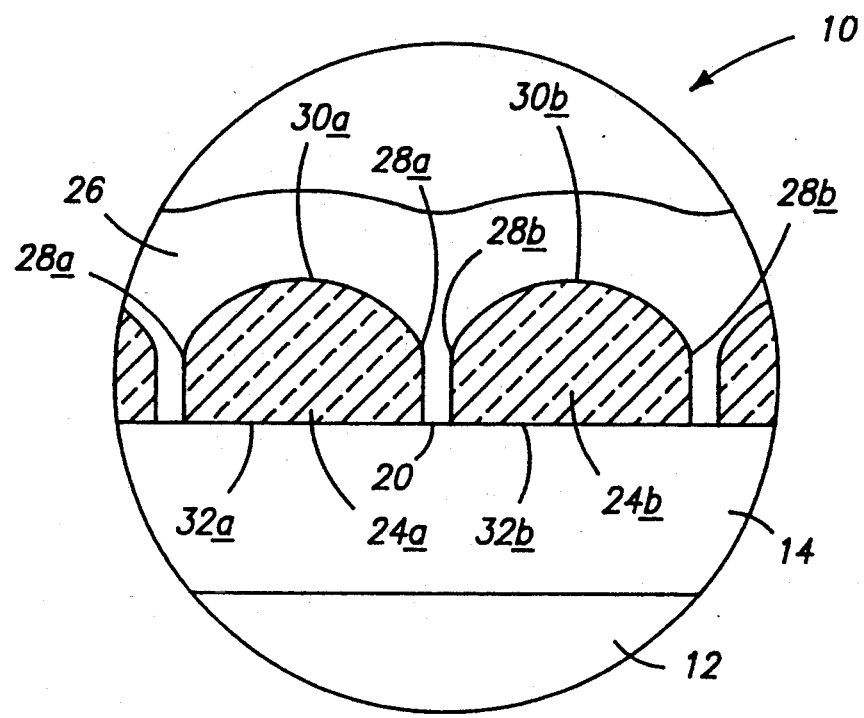
FIG. 3 is an enlarged view of a portion of the FIG. 2 wafer.

Referring to FIG. 2, polysilicon layer 16 is oxidized at a temperature from about 850° C. to about 1050° C. for a selected period of time to form $SiO_x$ material 26. $SiO_x$ material 26 will predominantly be $SiO_2$. $SiO_x$ 26 is formed within polysilicon layer 16 along grain boundaries 22 (FIG. 1) and down to base 20, thereby separating individual grains 24 of polysilicon within layer 16. Such is most readily viewable in FIGS. 2 and 3. FIG. 3, for example, illustrates a pair of adjacent polysilicon grains 24a and 24b. Such grains have respective sides 28a and 28b, tops 30a and 30b, and bases 32a and 32b. Base portions 32a and 32b are in contact with the layer 14 of substrate 10. As is apparent, $SiO_x$ 26 is provided about the depicted sides and tops of individual polysilicon grains 24a and 24b for separating individual grains 24a and 24b. $SiO_x$ 26, an insulating material, thereby increases the resistance along the conductively doped polysilicon than where such $SiO_x$ not present.

The preferred method of oxidation for formation of the $SiO_x$ is a wet oxidation conducted at from about 850° C. to about 950° C. Dry oxidations up to approximately 1050° C. would also be usable in accordance with the invention. Typically and preferably, the selected period of time to produce the illustrated construction for oxidation will be from about 15 minutes to about 45 minutes, dependant upon the thickness of polysilicon layer 16. Typically, the thickness of the combination of the polysilicon layer remaining and grown oxide layer will be 50% greater than the original polysilicon layer thickness. For example, where the original polysilicon layer is approximately 1000 Angstroms, an oxidation which consumes approximately 500 Angstroms of the polysilicon will produce a 1000 Angstrom thick layer of $SiO_x$ atop the grains, thereby producing an overall resistor thickness of approximately 1500 Angstroms.

Figure 4:
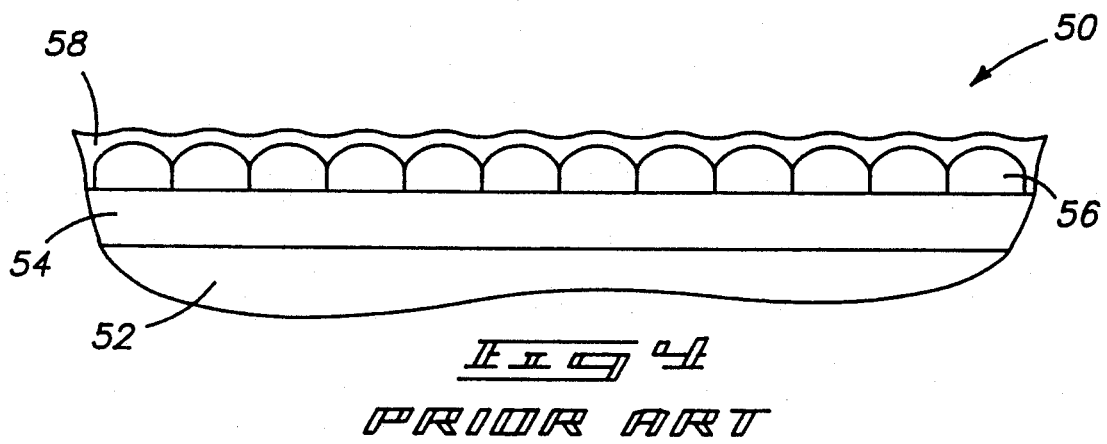
FIG. 4 is a diagrammatic section view of a wafer processed in accordance with a prior art method.

Polysilicon has been oxidized in the prior art by alternate techniques for different purposes, such as for roughening the upper polysilicon surface to increase capacitance. However, a process in accordance with the invention has heretofore never been utilized for formation of a polysilicon resistor. FIG. 4 illustrates an alternate prior art technique for roughening polysilicon. There illustrated is a semiconductor wafer fragment 50 comprised of a bulk substrate 52 and an $SiO_x$ layer 54 applied thereatop. A layer 56 polysilicon has been applied atop $SiO_2$ layer 54. Such layer is subjected to a comparatively low temperature, short time duration oxidation to controllably oxidize only the upper surface of polysilicon layer 56, thereby forming an upper layer 58 of oxide. During such oxidation techniques, low temperatures and short times are utilized to avoid complete oxidation, which would produce silicon dioxide downwardly to the base of polysilicon layer 56. Accordingly in roughening a polysilicon layer for purposes of increasing capacitance, the prior art does not contemplate oxidation through the polysilicon layer or oxidation of columnar grain silicon along grain boundaries. For capacitor formation of the prior art technique, oxide layer 58 is thereafter stripped to provide maximized surface area and conduction to an overlying capacitor dielectric layer.

Figure 5:
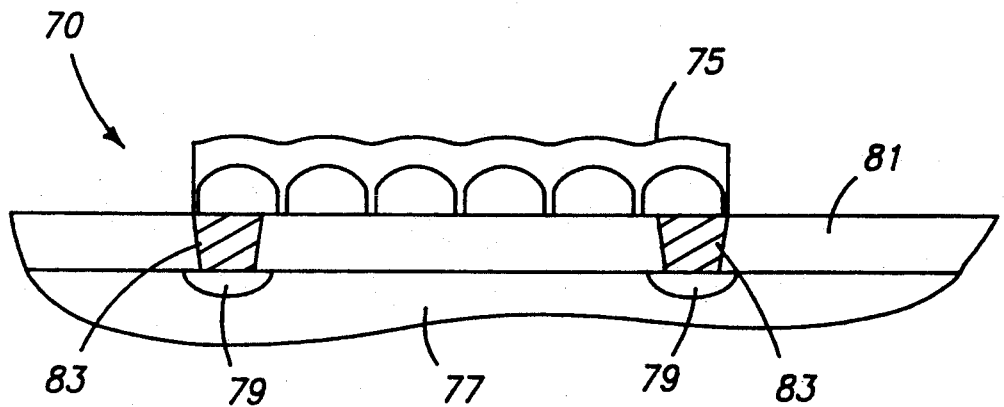
FIG. 5 is a diagrammatic section view of a semiconductor wafer having a resistor construction in accordance with the invention.

FIG. 5 illustrates a resistor device 75 provided atop a wafer fragment 70. Wafer fragment 70 includes a bulk substrate 77 having a pair of active device areas 79 formed therein. A layer of insulating oxide 81 is provided atop bulk substrate 77. A pair of contact openings 83 is provided in oxide layer 81. Openings 83 are provided with some conductive material, such as metal or polysilicon, up to the surface of insulating layer 81. Resistor 75 is comprised of a block region of material processed as described above in accordance with the invention for producing a desired resistance as would be easily determined by people of skill in the art. For example, the above described method is expected to produce a resistance increase of at least four orders of magnitude (10,000 times) over the same polysilicon layer dopant concentration of prior art methods wherein $SiO_x$ is not provided to separate into the base of individual polysilicon grains. The above described process provides tunneling of silicon dioxide between heavily doped grains and makes for a reliable resistor on a macroscopic scale. Even though the local density of the individual polysilicon grains might vary, the statistical average will be very consistent and easily controllable by process parameters to produce a desired resistor.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a resistor device comprising:
   providing a layer of conductively doped polysilicon atop a substrate to a selected thickness, the layer of polysilicon having an upper surface and a base, the layer of polysilicon having grain boundaries therewithin which extend from the upper surface to the base and define polysilicon grains;
   oxidizing the polysilicon layer at a temperature from about 850° C. to about 1050° C. for a selected period of time to form $SiO_x$ within the polysilicon layer along the grain boundaries and down to the base to separate individual grains of polysilicon within the layer; and
   patterning the oxidized polysilicon layer to form a resistor device within an integrated circuit.

2. The semiconductor processing method of forming a resistor of claim 1 wherein the selected thickness is from about 500 Angstroms to about 4000 Angstroms.

3. The semiconductor processing method of forming a resistor of claim 2 wherein the selected thickness is from about 1000 Angstroms to about 2000 Angstroms.

4. The semiconductor processing method of forming a resistor of claim 1 wherein the step of oxidizing is conducted by a wet oxidation at from about 850° C. to about 950° C.

5. The semiconductor processing method of forming a resistor of claim 1 wherein the selected period of time is from about 15 minutes to about 45 minutes.

6. The semiconductor processing method of forming a resistor of claim 1 wherein the step of oxidizing is conducted by a wet oxidation at from about 850° C. to about 950° C., and the selected period of time is from about 15 minutes to about 45 minutes.

7. The semiconductor processing method of forming a resistor of claim 1 wherein the selected thickness is from about 500 Angstroms to about 4000 Angstroms, and the step of oxidizing is conducted by a wet oxidation at from about 850° C. to about 950° C.

8. The semiconductor processing method of forming a resistor of claim 1 wherein the selected thickness is from about 500 Angstroms to about 4000 Angstroms, and the selected period of time is from about 15 minutes to about 45 minutes.

9. The semiconductor processing method of forming a resistor of claim 1 wherein the selected thickness is from about 500 Angstroms to about 4000 Angstroms, the step of oxidizing is conducted by a wet oxidation at from about 850° C. to about 950° C., and the selected period of time is from about 15 minutes to about 45 minutes.

10. The semiconductor processing method of forming a resistor of claim 1 wherein the selected thickness is from about 1000 Angstroms to about 2000 Angstroms, and the selected period of time is from about 15 minutes to about 45 minutes.

11. The semiconductor processing method of forming a resistor of claim 1 wherein the selected thickness is from about 1000 Angstroms to about 2000 Angstroms, and the step of oxidizing is conducted by a wet oxidation at from about 850° C. to about 950° C.

12. An integrated circuit incorporating the resistor device produced by the semiconductor processing method of claim 1.

13. An integrated circuit incorporating the resistor device produced by the semiconductor processing method of claim 2.

14. An integrated circuit incorporating the resistor device produced by the semiconductor processing method of claim 3.

15. An integrated circuit incorporating the resistor device produced by the semiconductor processing method of claim 4.

16. An integrated circuit incorporating the resistor device produced by the semiconductor processing method of claim 5.

17. An integrated circuit incorporating the resistor device produced by the semiconductor processing method of claim 7.

18. An integrated circuit incorporating the resistor device produced by the semiconductor processing method of claim 8.

19. An integrated circuit incorporating the resistor device produced by the semiconductor processing method of claim 9.

20. A resistor device within a semiconductor integrated circuit comprising:
    a region of conductively doped polysilicon grains provided atop a substrate, the polysilicon grains having side, top and base portions, the base portions contacting the substrate; and
    $SiO_x$ provided within the region about the sides and top of individual polysilicon grains, the $SiO_x$ extending between individual grains down to the substrate atop which the polysilicon grains are provided and separating individual grains thereby increasing the resistance of the conductively doped polysilicon than were such $SiO_x$ not present.

* * * * *